(12) United States Patent
Gu et al.

(10) Patent No.: US 11,430,877 B2
(45) Date of Patent: Aug. 30, 2022

(54) ION IMPLANTATION TO REDUCE NANOSHEET GATE LENGTH VARIATION

(71) Applicant: Applied Materials, Inc., Santa Clara, CA (US)

(72) Inventors: Sipeng Gu, Clifton Park, NY (US); Baonian Guo, Andover, MA (US); Qintao Zhang, Mt Kisco, NY (US); Wei Zou, Lexington, MA (US); Kyuha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 19 days.

(21) Appl. No.: 17/098,082

(22) Filed: Nov. 13, 2020

(65) Prior Publication Data
US 2022/0157968 A1    May 19, 2022

(51) Int. Cl.
| | | |
|---|---|---|
| *H01L 21/28* | (2006.01) | |
| *H01L 21/3213* | (2006.01) | |
| *H01L 21/3215* | (2006.01) | |
| *H01L 29/06* | (2006.01) | |
| *H01L 29/423* | (2006.01) | |
| *H01L 29/66* | (2006.01) | |
| *H01L 29/786* | (2006.01) | |

(52) U.S. Cl.
CPC .. *H01L 29/66545* (2013.01); *H01L 21/28132* (2013.01); *H01L 21/32155* (2013.01); *H01L 29/66742* (2013.01); *H01L 21/32139* (2013.01); *H01L 29/0673* (2013.01); *H01L 29/42392* (2013.01); *H01L 29/66553* (2013.01); *H01L 29/78696* (2013.01)

(58) Field of Classification Search
CPC ......... H01L 29/66545; H01L 21/28132; H01L 21/32155; H01L 29/66742; H01L 21/32139; H01L 29/0673; H01L 29/42392; H01L 29/66553; H01L 29/78696
USPC ........................................................ 438/478
See application file for complete search history.

(56) References Cited

U.S. PATENT DOCUMENTS

| | | | |
|---|---|---|---|
| 10,510,589 B2 | 12/2019 | Cheng et al. | |
| 2013/0043517 A1* | 2/2013 | Yin | ................... H01L 29/42376 257/E21.409 |
| 2019/0103284 A1 | 4/2019 | Yu et al. | |
| 2020/0279913 A1* | 9/2020 | Ebrish | ................. H01L 29/1079 |

FOREIGN PATENT DOCUMENTS

WO        2019013891        1/2019

* cited by examiner

*Primary Examiner* — Tong-Ho Kim
(74) *Attorney, Agent, or Firm* — KDB Firm PLLC

(57) ABSTRACT

Approaches herein decrease nanosheet gate length variations by implanting a gate layer material with ions prior to etching. A method may include forming a dummy gate structure over a nanosheet stack, the dummy gate structure including a hardmask atop a gate material layer, and removing a portion of the hardmask to expose a first area and a second area of the gate material layer. The method may further include implanting the dummy gate structure to modify the first and second areas of the gate material layer, and etching the first and second areas of the gate material layer to form a treated layer along a sidewall of a third area of the gate material layer, wherein the third area is beneath the hardmask.

20 Claims, 7 Drawing Sheets

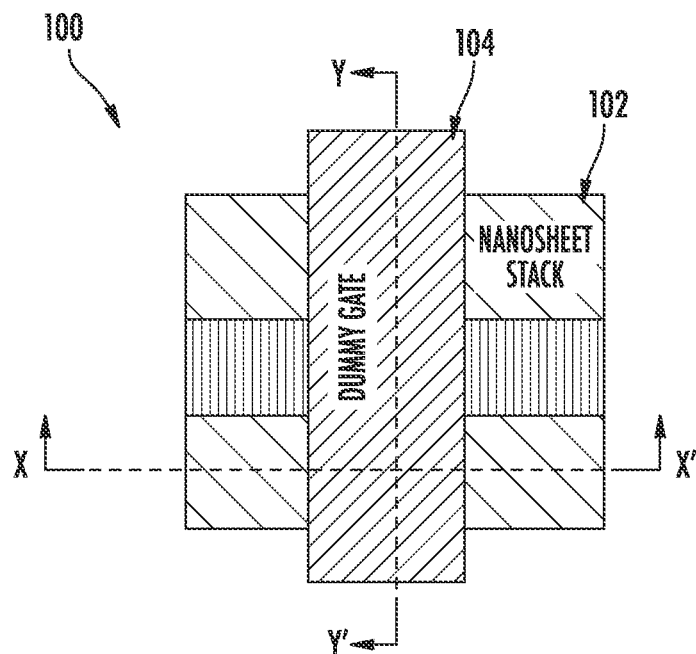
FIG. 1
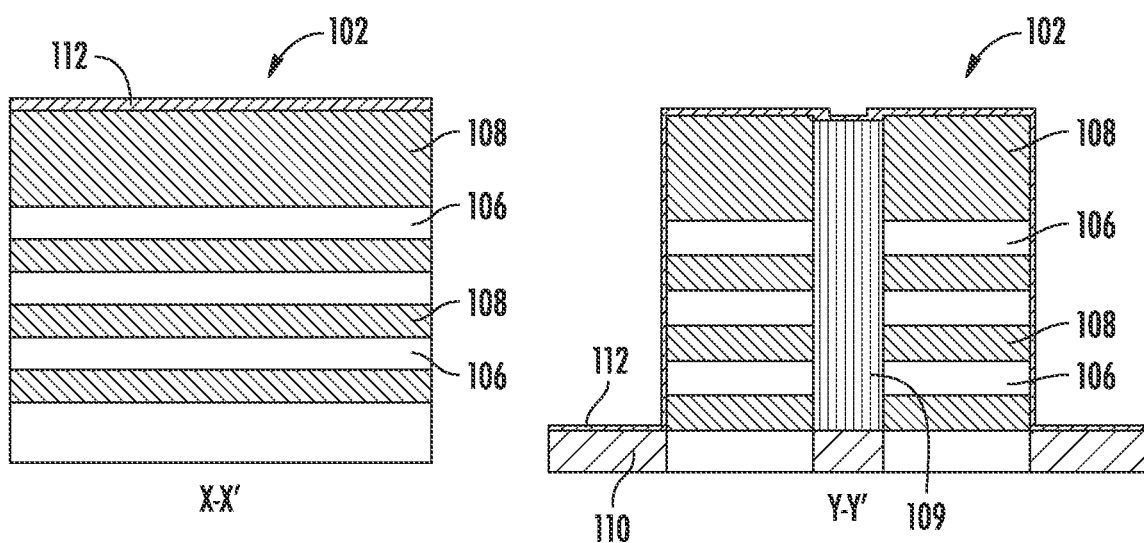
FIG. 2A
FIG. 2B

ION IMPLANTATION TO REDUCE NANOSHEET GATE LENGTH VARIATION

FIELD OF THE DISCLOSURE

The present embodiments relate to semiconductor device patterning, and more particularly, to techniques for implanting dummy gate layers with ions to reduce nanosheet gate length variation by improving etch performance.

BACKGROUND OF THE DISCLOSURE

As integrated circuit (IC) technologies progress towards smaller technology nodes, multi-gate devices have been used to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors, both also referred to as non-planar transistors, are examples of multi-gate devices that provide high performance and low leakage applications. A GAA transistor, e.g., a nanosheet transistor or a nanowire transistor, has a gate structure that can extend, partially or fully, around a channel region to provide access to the channel region on two or more sides. The channel region of the GAA transistor may be formed from nanowires, nanosheets, or other nanostructures. However, integration of different multi-gate devices, including nanowire and/or nanosheet transistors, on one integrated circuit, is challenging and complex.

For active gate lengths less than 14 nm, gate length control is critical for stable electrostatic performance. This is especially true for 3/2 nm GAA transistors. Lateral etch rate differences, e.g., due to polysilicon crystallization orientation, results in rough or non-uniform sidewall surfaces, which leads to vertical profile distortion. As processing continues, a conformal spacer subsequently formed over the non-uniform sidewall surfaces inherits the vertical profile distortion, leading to inconsistent gate length patterning.

Accordingly, improved approaches are needed to control gate length variation during processing.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a gate structure over a nanosheet stack, the gate structure including a hardmask atop a gate material layer, and removing a portion of the hardmask to expose a first area and a second area of the gate material layer. The method may further include implanting the gate structure to modify the first and second areas of the gate material layer, and etching the first and second areas of the gate material layer to form a treated layer along a sidewall of a third area of the gate material layer, wherein the third area is beneath the hardmask.

In another aspect, a method of reducing gate length variation may include forming a dummy gate structure over a nanosheet stack, the dummy gate structure including a hardmask atop a silicon layer, and removing a portion of the hardmask to expose a first area and a second area of the silicon layer. The method may further include implanting the dummy gate structure to modify the first and second areas of the silicon layer, and etching the first and second areas of the gate material layer to form a treated layer along a sidewall of a third area of the gate material layer, wherein the third area is beneath the hardmask.

In yet another aspect, a method of reducing lateral etch rate variation may include forming a dummy gate structure over a nanosheet stack, the dummy gate structure including a hardmask atop a gate material layer, removing a portion of the hardmask to expose a first area and a second area of the gate material layer, and implanting the dummy gate structure to modify the first and second areas of the gate material layer. The method may further include etching the first and second areas of the gate material layer to form a treated layer along a sidewall of a third area of the gate material layer, wherein the third area is beneath the hardmask. The method may further include forming a spacer along the treated layer, and etching a portion of the nanosheet stack to form an active gate beneath the third area of the gate material layer, wherein a sidewall of the spacer is co-planar with a sidewall of the active gate.

BRIEF DESCRIPTION OF THE DRAWINGS

The accompanying drawings illustrate exemplary approaches of the disclosure, including the practical application of the principles thereof, as follows:

FIG. 1 illustrates a plan view of an exemplary device, according to embodiments of the present disclosure;

FIGS. 2A-2B illustrate formation of a nanosheet stack according to embodiments of the present disclosure;

Figure 3A:
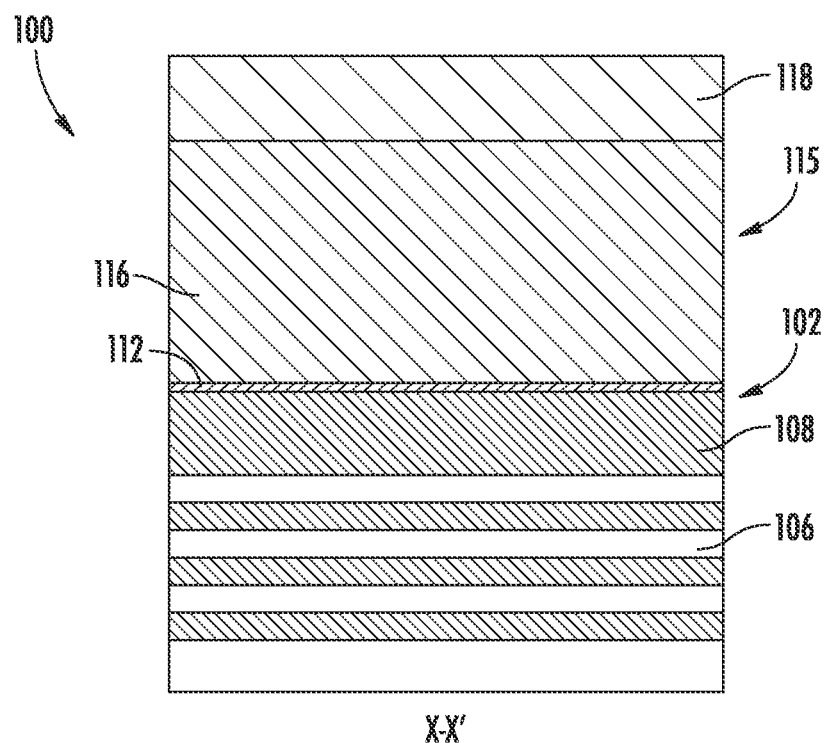
FIGS. 3A-3B illustrate formation of a hardmask and a dummy gate structure over the nanosheet stack according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously reduce dummy gate CD variation and improve nanosheet gate length uniformity by implanting ion species to form amorphized or heavy doped polysilicon, which leads to lateral poly gate etch rate variation reduction. In some embodiments, when heavy doping (e.g., $10^{20}$ $cm^{-3}$) of n-type ions (e.g., phosphorous, arsenic, antimony) is employed, nearly equal etch rates may be achieved regardless of crystalline orientation. In some embodiments, when silicon of the gate is amorphized, better post-etch surface roughness can be achieved on amorphous silicon (a-Si) vs. polysilicon because of the uniform a-Si structure. A pre-amorphization ion treatment process, e.g., with Si, germanium (Ge), xenon (Xe), or indium (In) may be used in some embodiments.

FIG. 1 illustrates a plan view of a semiconductor device (hereinafter "device") 100 according to one or more embodiments described herein. The device 100 may include a nanosheet stack 102 and a dummy gate 104. Although non-limiting, the device 100 may be a GAA device structure, a vertical GAA device structure, a horizontal GAA device structure, or a fin field effect transistor (FinFET) device structure. When describing the figures hereinafter, a figure suffixed "A" is a cross section of the partially processed device 100 along line X-X' in FIG. 1 and a figure suffixed "B" is a cross section of the same partially processed device 100 along line Y-Y' in FIG. 1.

FIGS. 2A-2B demonstrate the device 100 following formation of the nanosheet stack 102. In some embodiments, the nanosheet stack 102 may be formed by depositing a series of alternating layers of silicon 106 and silicon germanium 108 over a base layer 110, such as a silicon. An etch stop layer 112, such as silicon dioxide, may be formed over the base layer 110 and over the alternating layers of silicon 106 and silicon germanium 108. In some embodiments, the nanosheet stack 102 may include a dielectric wall 109 (e.g., silicon dioxide). Other nanosheet stack layering configurations and materials are possible in alternative embodiments.

Figure 3B:
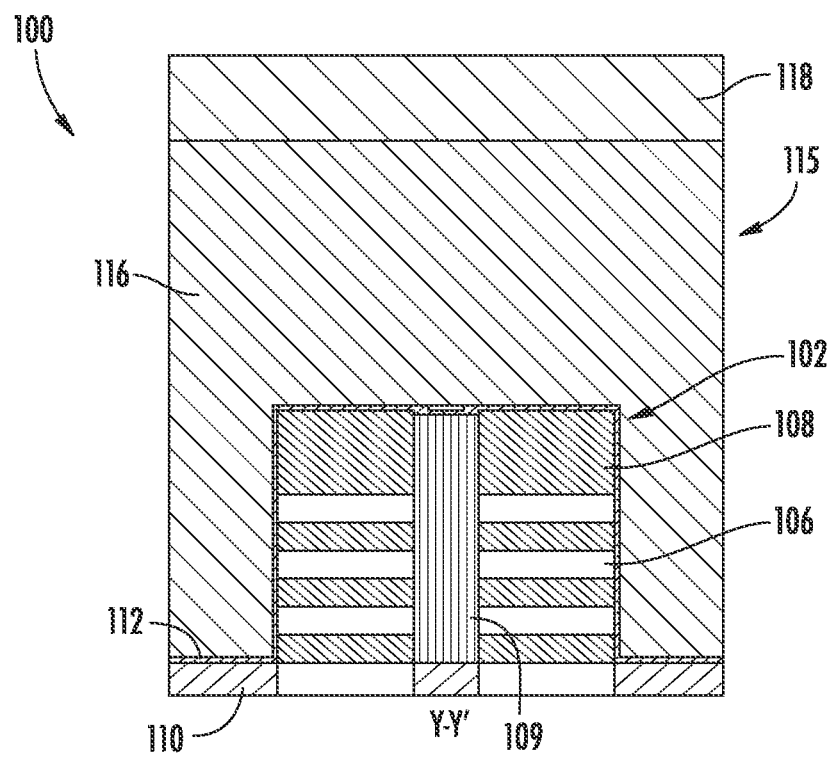

FIGS. 3A-3B demonstrate the device 100 following formation of a gate structure 115 over the nanosheet stack 102. In some embodiments, the gate structure 115 is a dummy gate structure including a gate material layer 116 and a hardmask 118. As shown, the gate material layer 116 may be formed atop the etch stop layer 112. In some embodiments, the gate material layer 116 may be an amorphous silicon (a-Si) or a polysilicon. The hardmask 118 may be conformally deposited over the gate material layer 116.

Figure 4A:
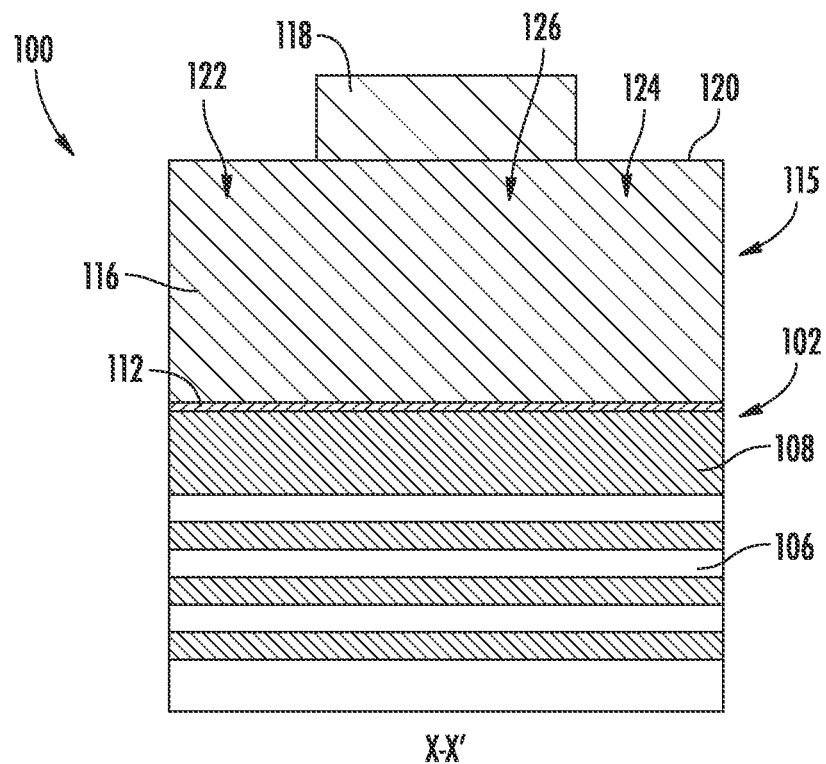
FIGS. 4A-4B illustrate patterning of the hardmask according to embodiments of the present disclosure.
Figure 4B:
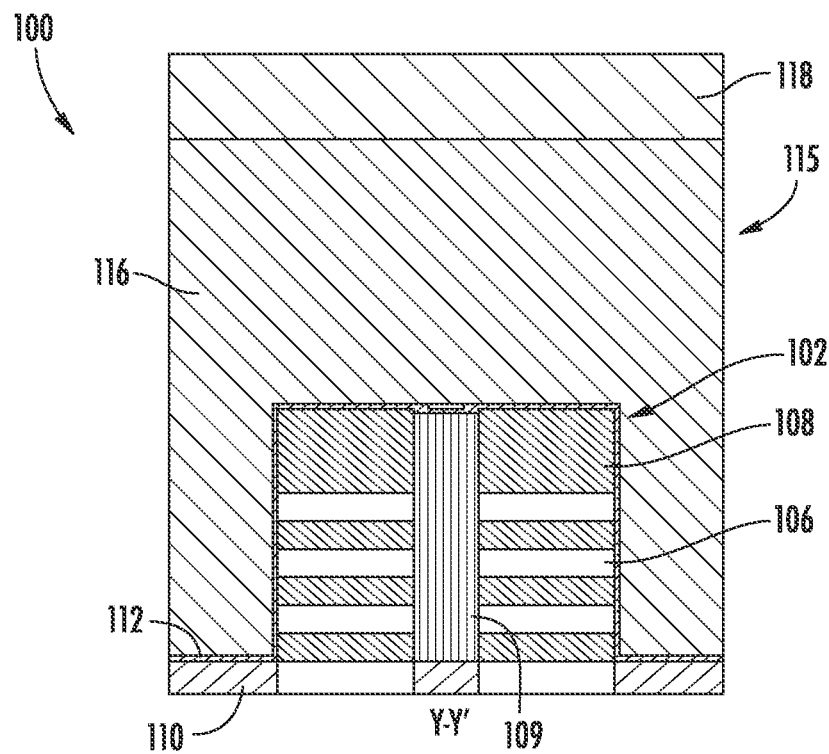

FIGS. 4A-4B demonstrate the device 100 following removal of a portion of the hardmask 118. As best shown in FIG. 4A, the hardmask 118 may be etched, selective to a top surface 120 of the gate material layer 116, to expose a first area 122 and a second area 124 of the gate material layer 116. The hardmask 118 may remain over a third area 126 of the gate material layer 116.

Figure 5A:
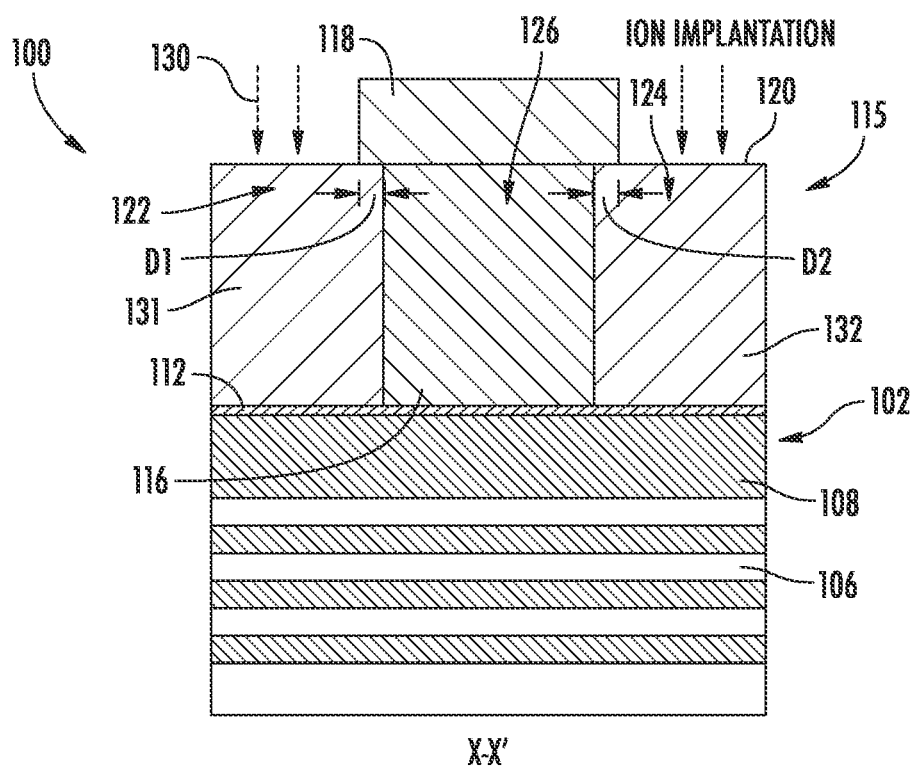
FIGS. 5A-5B illustrate an ion implant to the dummy gate structure according to embodiments of the present disclosure.
Figure 5B:
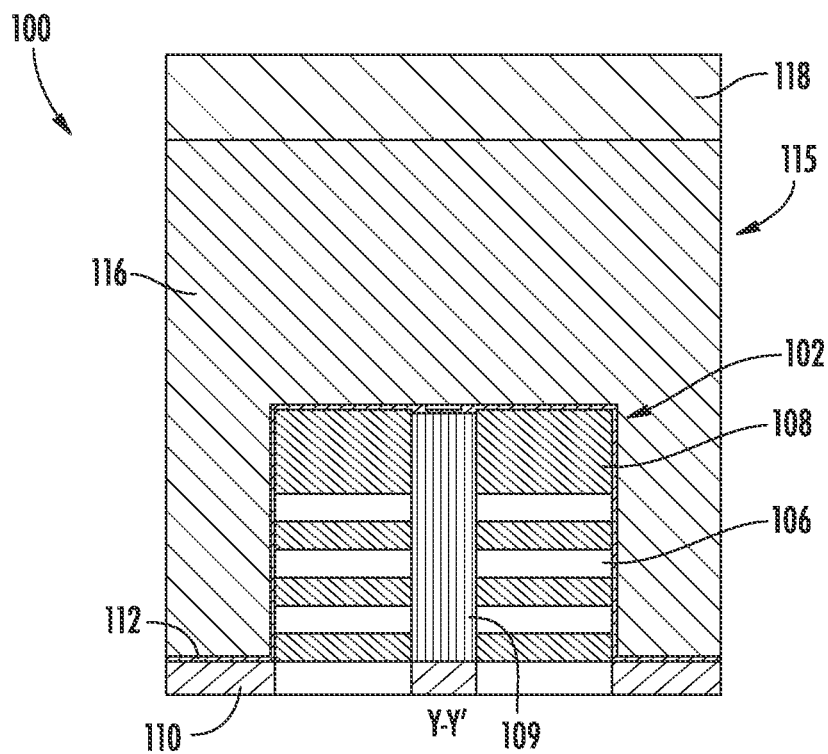

FIGS. 5A-5B demonstrate the device 100 following an ion implantation 130 to the gate structure 115. Due to the presence of the hardmask 118, the ion implantation 130 modifies the gate material layer 116 in the first and second areas 122, 124 without substantially modifying the gate material layer 116 in the third area 126. In some embodiments, the ion implantation 130 may include a high-mass/heavy doping (e.g., $10^{20}$ $cm^{-3}$) of n-type ions (e.g., phosphorous, arsenic, antimony). Other ion species are possible. Furthermore, in some embodiments, the ion implantation 130 is an amorphization implant. As shown, the ion implantation 130 may be vertical, i.e., delivered at an angle substantially perpendicular to a plane defined by the top surface 120 of the gate material layer 116. In other embodiments, the ion implantation 130 may be delivered at an angle.

In some embodiments, the ion implantation 130 may include one or multiple implant processes to generate a first treated area 131 and a second treated area 132. As shown, the first and second treated areas 131, 132 may extend laterally, beneath the hardmask 118, e.g., by distances 'D1' and 'D2', respectively. In various embodiments, D1 and D2 may be different or the same.

In some embodiments, the gate material layer 116 may be treated with a first species penetrating to a first depth or thickness, and a second species penetrating to a second depth or thickness. For example, when the ion implantation 130 is an amorphization implant, the first process may be a pre-amorphization ion treatment process, e.g., with Si, Ge, Xe, or In. The second process may be a Ge ion implant at approximately 30 Kev, with a dose of approximately $10^{14}$. Embodiments herein are not limited in this context, however.

The ion implantation energy, temperature, and ion dose of ion implantation 130 may be selected to modify all or a portion of the first and second areas 122, 124, which may extend to the etch stop layer 112. In some embodiments, the ion implantation 130 may homogenize the first treated area 131 and the second treated area 132 to eliminate or reduce a chemical and mechanical gradient affecting the profile and etching properties. In other embodiments, the first treated area 131 and the second treated area 132 are densified following polymer reorganization and reflow of gate material layer 116.

Figure 6A:
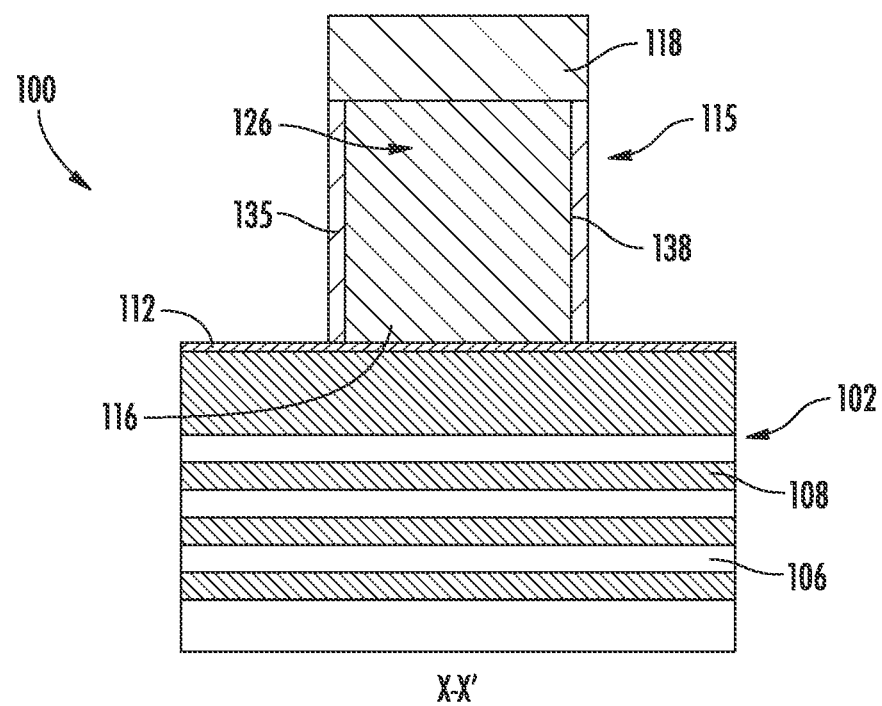
FIGS. 6A-6B illustrate removal of a portion of the dummy gate structure according to embodiments of the present disclosure.
Figure 6B:
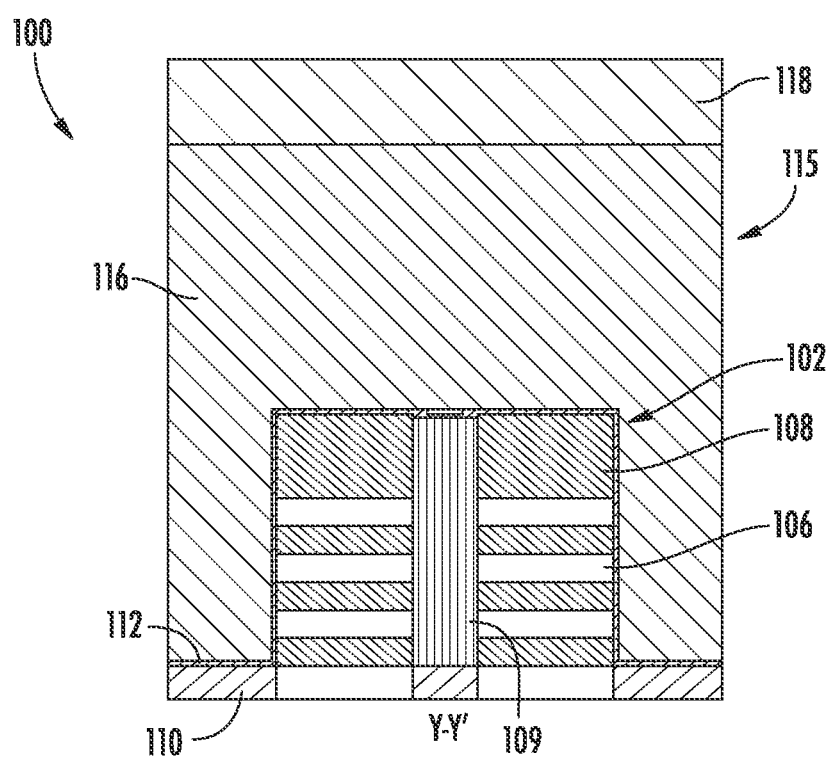

FIGS. 6A-6B illustrate the device 100 following removal of a portion of the dummy gate structure 115. As shown, the first and second areas 122, 124 of the gate material layer 116 may be removed (e.g., etched) selective to the etch stop layer 112, while a treated layer 135 remains along a sidewall 138 of the third area 126 of the gate material layer 116. In exemplary embodiments, the treated layer 135 is covered by the hardmask 118, which prevents it from being removed during the etch process. Due to the prior ion implantation 130, the treated layer 135 provides a more smooth/uniform exterior surface.

Figure 7A:
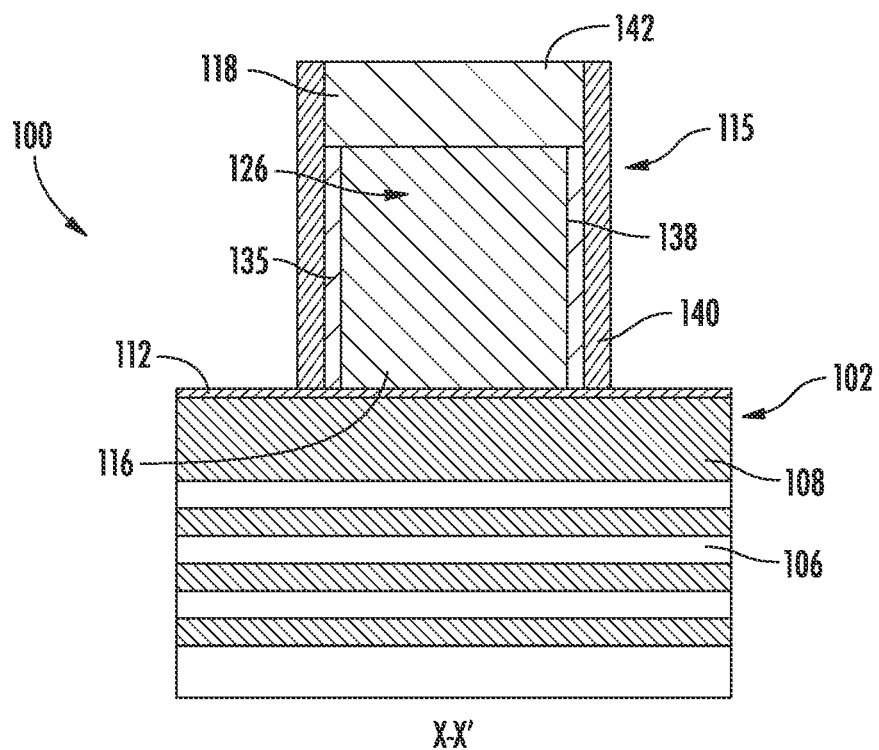
FIGS. 7A-7B illustrate formation of a spacer according to embodiments of the present disclosure.
Figure 7B:
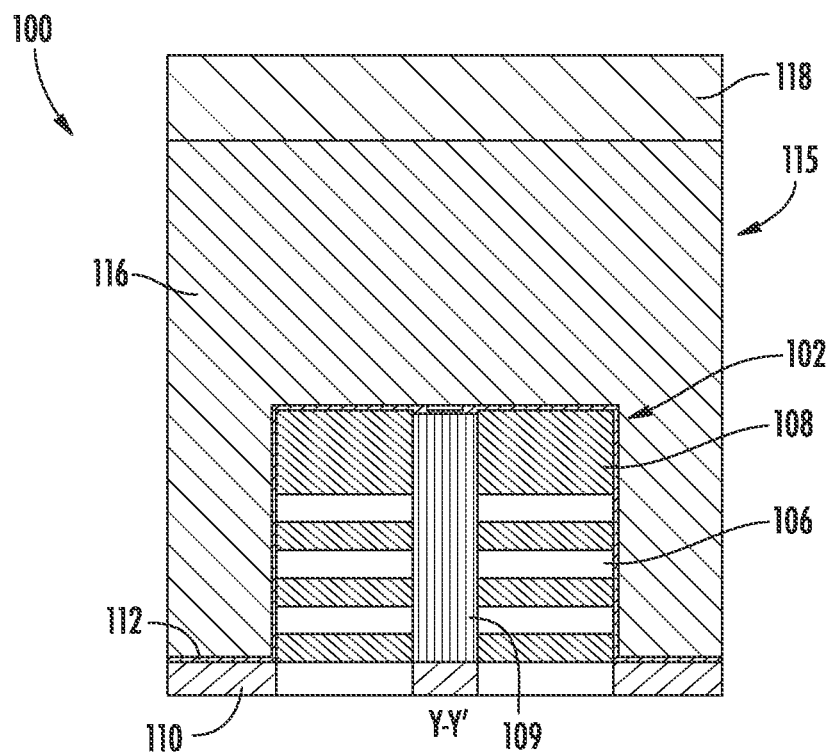

FIGS. 7A-7B demonstrate a spacer 140 formed along the dummy gate structure 115. More specifically, the spacer 140 may be conformally formed along an exterior of the treated layer 135. As shown, the spacer 140 may be formed along an entire height of the dummy gate structure 115, e.g., between the etch stop layer 112 and a top surface 142 of the hardmask 118. In some embodiments, the spacer 140 is silicon dioxide deposit having a smooth/uniform exterior surface profile due to the reduced roughness of the treated layer 135. Said differently, the spacer 140 is less likely to inherit vertical profile distortion from the treated layer 135, resulting in more consistent patterning during later processing steps.

Figure 8A:
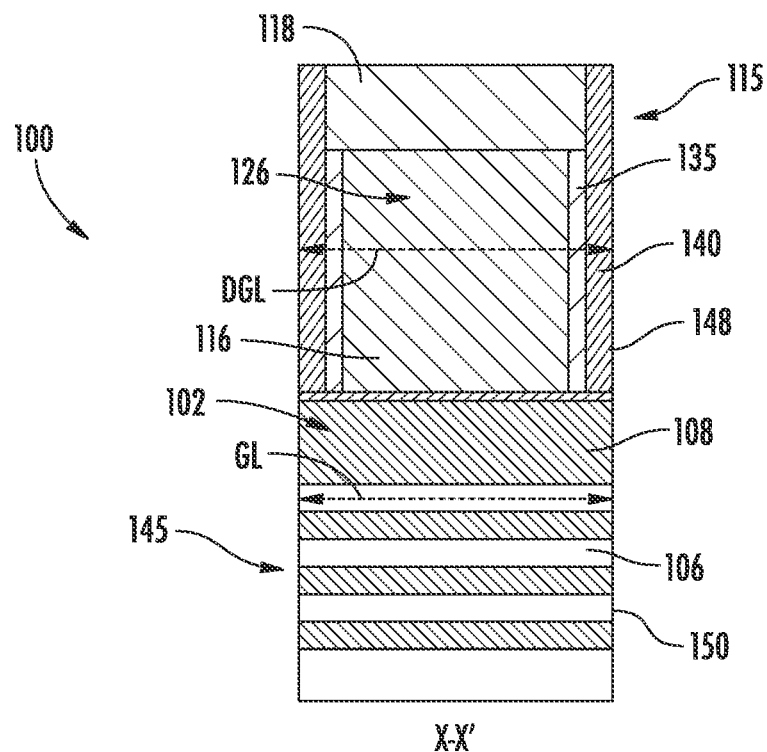
FIGS. 8A-8B illustrate removal of a portion of the nanosheet stack according to embodiments of the present disclosure.
Figure 8B:
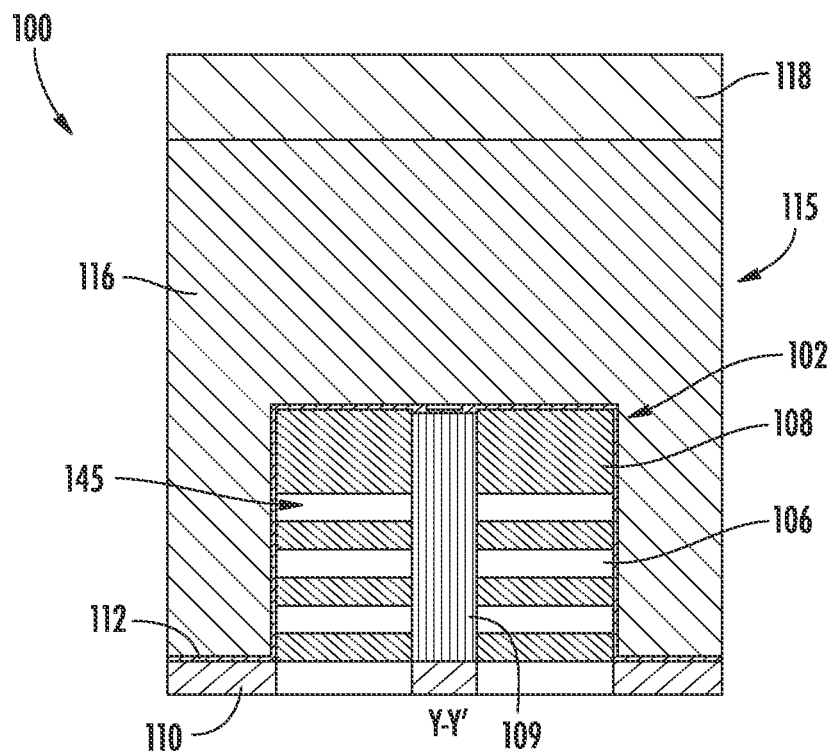

FIGS. 8A-8B demonstrate the device 100 following removal of a portion of the nanosheet stack 102 to form a nanosheet active gate 145. In some embodiments, a vertical etch process may remove those areas of the nanosheet stack 102 not covered/protected by the dummy gate structure 115. More specifically, the third area 126 of the gate material layer 116, the treated layer 135, and the spacer 140 act as a profiling mask for nanosheet etching to control nanosheet active gate 145 length 'GL'. As shown, GL is substantially equal to a dummy gate length 'DGL'. Said another way, a sidewall 148 of the spacer 140 is substantially co-planar with a sidewall 150 of the active gate 145 along an entire height of the nanosheet active gate 145 and the dummy gate structure 115.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In various embodiments, design tools can be provided and configured to create the datasets used to produce the void-free trench-fills described herein. For example, data sets can be created to directionally etch a seed layer from predetermined portion of a trench and/or fin as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, application-specific integrated circuits (ASICs), programmable logic arrays (PLAs), logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
    forming a gate structure over a nanosheet stack, the gate structure including a hardmask atop a gate material layer;
    removing a portion of the hardmask to expose a first area and a second area of the gate material layer;
    implanting the gate structure to modify the first and second areas of the gate material layer; and
    etching the first and second areas of the gate material layer to form a treated layer along a sidewall of a third area of the gate material layer, wherein the third area is beneath the hardmask.

2. The method of claim 1, further comprising forming a spacer along the treated layer.

3. The method of claim 2, further comprising removing a portion of the nanosheet stack to form an active gate, wherein a sidewall of the spacer is co-planar with a sidewall of the active gate.

4. The method of claim 1, further comprising forming the treated layer beneath the hardmask.

5. The method of claim 1, further comprising depositing a series of alternating layers of silicon and silicon germanium to form the nanosheet stack.

6. The method of claim 5, further comprising forming an etch stop layer atop the series of alternating layers of silicon and silicon germanium, wherein the gate structure is formed over the etch stop layer.

7. The method of claim 1, further comprising modifying the first and second areas of the gate material layer by amorphizing the first and second areas or by doping the first and second areas with ions of the implant.

8. The method of claim 1, wherein implanting the gate structure comprises performing a vertical ion implant to the gate structure, wherein the gate material layer is amorphous silicon.

9. A method of reducing gate length variation, comprising:
    forming a dummy gate structure over a nanosheet stack, the dummy gate structure including a hardmask atop a silicon layer;
    removing a portion of the hardmask to expose a first area and a second area of the silicon layer;
    implanting the dummy gate structure to modify the first and second areas of the silicon layer; and
    etching the first and second areas of the gate material layer to form a treated layer along a sidewall of a third area of the silicon layer, wherein the third area is beneath the hardmask.

10. The method of claim 9, further comprising forming a spacer along the treated layer, wherein the spacer extends to a top surface of the dummy gate structure.

11. The method of claim 10, further comprising removing a portion of the nanosheet stack to form an active gate, wherein a sidewall of the spacer is co-planar with a sidewall of the active gate.

12. The method of claim 9, further comprising forming the treated layer beneath the hardmask.

13. The method of claim 9, further comprising:
depositing a series of alternating layers of silicon and silicon germanium to form the nanosheet stack; and
forming an etch stop layer atop the series of alternating layers of silicon and silicon germanium, wherein the silicon layer is formed over the etch stop layer.

14. The method of claim 9, further comprising modifying the first and second areas of the silicon layer by amorphizing the first and second areas or by doping the first and second areas with n-type phosphorous ions, arsenic ions, or antimony ions.

15. The method of claim 9, wherein implanting the dummy gate structure comprises performing a vertical ion implant to the dummy gate structure, wherein the silicon layer is amorphous silicon.

16. A method of reducing lateral etch rate variation, comprising:
forming a dummy gate structure over a nanosheet stack, the dummy gate structure including a hardmask atop a gate material layer;
removing a portion of the hardmask to expose a first area and a second area of the gate material layer;
implanting the dummy gate structure to modify the first and second areas of the gate material layer;
etching the first and second areas of the gate material layer to form a treated layer along a sidewall of a third area of the gate material layer, wherein the third area is beneath the hardmask;
forming a spacer along the treated layer; and
etching the nanosheet stack to form an active gate beneath the third area of the gate material layer, wherein a sidewall of the spacer is co-planar with a sidewall of the active gate.

17. The method of claim 16, further comprising forming the treated layer beneath the hardmask.

18. The method of claim 16, further comprising:
depositing a series of alternating layers of silicon and silicon germanium to form the nanosheet stack; and
forming an etch stop layer atop the series of alternating layers of silicon and silicon germanium, wherein the dummy gate structure is formed over the etch stop layer.

19. The method of claim 16, further comprising modifying the first and second areas of the gate material layer by amorphizing the first and second areas or by doping the first and second areas with an ion implant.

20. The method of claim 16, further comprising performing a vertical ion implant to the dummy gate structure to modify the first and second areas of the gate material layer, wherein the gate material layer is amorphous silicon.

* * * * *